US008087823B2

(12) United States Patent
Aube et al.

(10) Patent No.: US 8,087,823 B2
(45) Date of Patent: Jan. 3, 2012

(54) METHOD FOR MONITORING THERMAL CONTROL (75) Inventors: Francois Aube, PQ (CA); Timothy M. Curtin, Burlington, VT (US); Matthew S. Grady, Burlington, VT (US); Thomas P. Scanlon, Jericho, VT (US); Eric N. Smith, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 689 days.

(21) Appl. No.: 12/193,497

(22) Filed: Aug. 18, 2008

(65) Prior Publication Data

US 2010/0042355 A1    Feb. 18, 2010

(51) Int. Cl.
G01K 1/00 (2006.01)
G01K 7/00 (2006.01)
G01K 3/00 (2006.01)
H01L 35/00 (2006.01)

(52) U.S. Cl. ........................................ 374/100; 374/170
(58) Field of Classification Search .................. 374/100, 374/170, 171, 172, 178, 180
See application file for complete search history.

(56) References Cited

U.S. PATENT DOCUMENTS

| 4,204,133 | A | * | 5/1980 | Ahmed | 374/E7.035 |
| 4,574,205 | A | * | 3/1986 | Nagano | 374/E7.035 |
| 5,440,305 | A | * | 8/1995 | Signore et al. | 374/E15.001 |
| 5,997,174 | A | | 12/1999 | Wyland | |
| 6,183,131 | B1 | * | 2/2001 | Holloway et al. | 374/172 |
| 6,423,604 | B1 | | 7/2002 | Long et al. | |
| 6,442,500 | B1 | * | 8/2002 | Kim | 374/101 |
| 6,549,026 | B1 | | 4/2003 | DiBattista et al. | |
| 6,552,561 | B2 | | 4/2003 | Olsen et al. | |
| 6,577,146 | B2 | | 6/2003 | Gamache et al. | |
| 6,662,136 | B2 | | 12/2003 | Lamb et al. | |
| 6,867,611 | B2 | | 3/2005 | Stone | |
| 7,003,424 | B2 | | 2/2006 | Ravatin et al. | |
| 7,141,953 | B2 | | 11/2006 | Cohen et al. | |

(Continued)

FOREIGN PATENT DOCUMENTS

JP    2001-272434    10/2001

OTHER PUBLICATIONS

Kara, et al., "Thermal Measurement on Silicon Chip," IBM Technical Disclosure Bulletin, vol. 29, No. 7, Dec. 1986, pp. 2999-3000.

(Continued)

*Primary Examiner* — Yaritza Guadalupe-McCall
(74) *Attorney, Agent, or Firm* — Gibb I.P. Law Firm, LLC; Michael J. LeStrange, Esq.

(57) ABSTRACT

A structure has a heat dissipating feature, an internal temperature measurement device, and a memory. The structure generates heat as power is supplied to the structure, and a threshold voltage of the internal temperature measurement device changes as the temperature of the temperature measurement device changes. The embodiments herein establish a linear relationship between temperature and threshold voltage by heating the structure to a first temperature and recording a first threshold voltage, and then heating the structure to a second temperature and recording a second threshold voltage. From this, the embodiments herein calculate a linear relationship between temperature and threshold voltage. Further, the embodiments herein can calculate the temperatures of the structure based only upon the linear relationship and threshold voltages measured from internal temperature measurement device.

20 Claims, 6 Drawing Sheets

U.S. PATENT DOCUMENTS

| | | |
|---|---|---|
| 7,248,988 B2 | 7/2007 | Sheng et al. |
| 7,313,500 B2 | 12/2007 | Morman |
| 7,317,605 B2 | 1/2008 | Donze et al. |
| 7,524,108 B2* | 4/2009 | Yoshida et al. ............... 374/178 |
| 7,556,423 B2* | 7/2009 | Caliboso ............................ 374/1 |
| 7,703,975 B2* | 4/2010 | Kim ............................. 374/170 |
| 7,726,877 B1* | 6/2010 | Avitan ........................... 374/170 |
| 7,857,510 B2* | 12/2010 | Liepold et al. ................. 374/178 |
| 2004/0047398 A1* | 3/2004 | Koinuma et al. ............. 374/180 |
| 2005/0099752 A1* | 5/2005 | Liepold et al. ................ 374/185 |
| 2006/0202821 A1* | 9/2006 | Cohen ........................... 374/100 |
| 2006/0263912 A1 | 11/2006 | Arroyo et al. |
| 2007/0171956 A1* | 7/2007 | Noguchi ....................... 374/100 |
| 2010/0124251 A1* | 5/2010 | Peterson et al. .............. 374/171 |
| 2010/0141329 A1* | 6/2010 | Kim ............................... 374/170 |
| 2011/0096809 A1* | 4/2011 | Campos et al. ............... 374/178 |
| 2011/0158286 A1* | 6/2011 | Peterson ....................... 374/170 |

OTHER PUBLICATIONS

Spanner, R.A., "Junction Voltage Thermometer," IBM Technical Disclosure Bulletin, vol. 34, No. 2, Jul. 1991, pp. 208-210.

Ayers, R.L., "Method for Measuring Actual Junction Temperature and Package Thermal Resistance on LSI and VLSI Devices," Reproduced from Research Disclosure, Sep. 1987, No. 281, 1 page.

* cited by examiner

Figure 8

METHOD FOR MONITORING THERMAL CONTROL

BACKGROUND

1. Field of the Invention

Embodiments of the invention generally relate to testing integrated circuit devices, and more particularly to methods and systems that improve the ease of which the temperature of the integrated circuit devices being tested is determined by establishing a relationship between threshold voltage of an on-chip temperature sensor and temperature.

2. Description of the Related Art

Many integrated circuit (device) test and use applications require precise thermal control of the device under test or in use. Without such control, the power consumed by these devices can cause the temperature of the device to vary widely from part to part, reducing the quality of the test, degrading the performance of the device, or even damaging the device. The embodiments herein provide a method for monitoring the quality of the thermal control, so that corrective actions can be taken if the thermal control begins to fail or loses effectiveness.

SUMMARY

In view of the foregoing, disclosed herein is a method and system of monitoring thermal resistance of a solution employed in a semiconductor test apparatus. The embodiments herein use an on-chip thermal sensor that is adapted to measure a junction temperature of a first device under test, and an apparatus adapted to supply and measure power consumed by the first device. Methods herein calculate the thermal resistance based on the first junction temperature and power dissipated by the first device and the method can determine whether the thermal resistance exceeds a predefined specification. One aspect of embodiments herein is that the device under test monitors the thermal solution itself, and can more readily detect excursions and problems.

More specifically, the embodiments herein relate to a structure that has a heat dissipating feature (e.g., heatsink); an internal temperature measurement device (e.g., an on-chip temperature sensor having a PN junction diode); and a memory (computer storage medium). The structure generates heat as power is supplied to the structure, and a threshold voltage of the internal temperature measurement device changes as the temperature of the temperature measurement device changes. The embodiments herein establish a linear relationship between temperature and threshold voltage by heating the structure to a first temperature and recording a first threshold voltage of the internal temperature measurement device at the first temperature, and then heating the structure to a second temperature (different than the first temperature) and recording a second threshold voltage of the internal temperature measurement device at the second temperature. From this, the embodiments herein can calculate a linear relationship between temperature and threshold voltage based on the first temperature, the first threshold voltage, the second temperature, and the second threshold voltage. The embodiments herein can then output and store the linear relationship. The personality of every device in terms of threshold voltage response to temperature is calculated/stored on a device-by device basis, and the data used for that individual device. In the present product where thermal resistance monitoring is performed, the threshold voltage values are actually stored on board the chip in electronic fuses. Every chip has its own personal record. However, this could be stored externally in a typical computer/database/network as described in FIG. 8.

In one specific embodiment, the process of calculating the temperatures of the other devices is based on the following equation: $Vt=m(T)+int$, where $Vt$ is the threshold voltage, $T$ is temperature, $m$ is a slope of the linear relationship, and $int$ is a point at which the linear relationship intersects a 0° temperature.

BRIEF DESCRIPTION OF THE DRAWINGS

The embodiments of the invention will be better understood from the following detailed description with reference to the drawings, which are not necessarily drawing to scale and in which.

DETAILED DESCRIPTION

The invention and the various features and advantageous details thereof are explained more fully with reference to the non-limiting embodiments that are illustrated in the accompanying drawings and detailed in the following description.

As mentioned above, without precise thermal control of the device under test, the power consumed by tested devices can cause the temperature of the device to vary widely from part to part. The result of such lack of control can be failure of the device, compromise in quality of test, and even damage to the device if the power is large enough and the temperature rise great enough.

Figure 1:
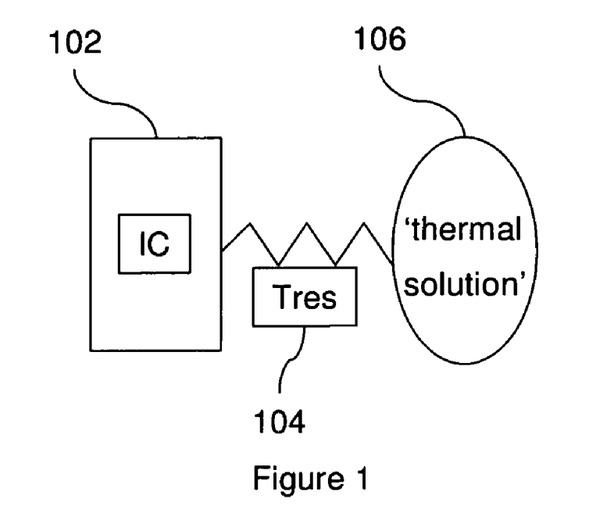
FIG. 1 is a schematic drawing of the relationship between a device, a thermal solution and the associated thermal response.

As shown in FIG. 1, thermal resistance (Tres) shown as item 104, is a commonly used term to describe a thermal solution's (device's) 106 capability to handle heat generated by device, such as an integrated circuit (IC) device, shown in FIG. 1 as item 102. As the device 102 consumes power, it generates heat and the "thermal solution" 106 (a thermal device, such as a heatsink, a cooling fan, cooling liquid, cooling gas, etc.) takes away the heat energy with a thermal resistance 104 measured in degrees Celsius per Watt (C/W). For example, if the device consumes 10 W, and the temperature of the device 102 rises 5C, the thermal resistance is 0.5 C/W.

Figure 2:
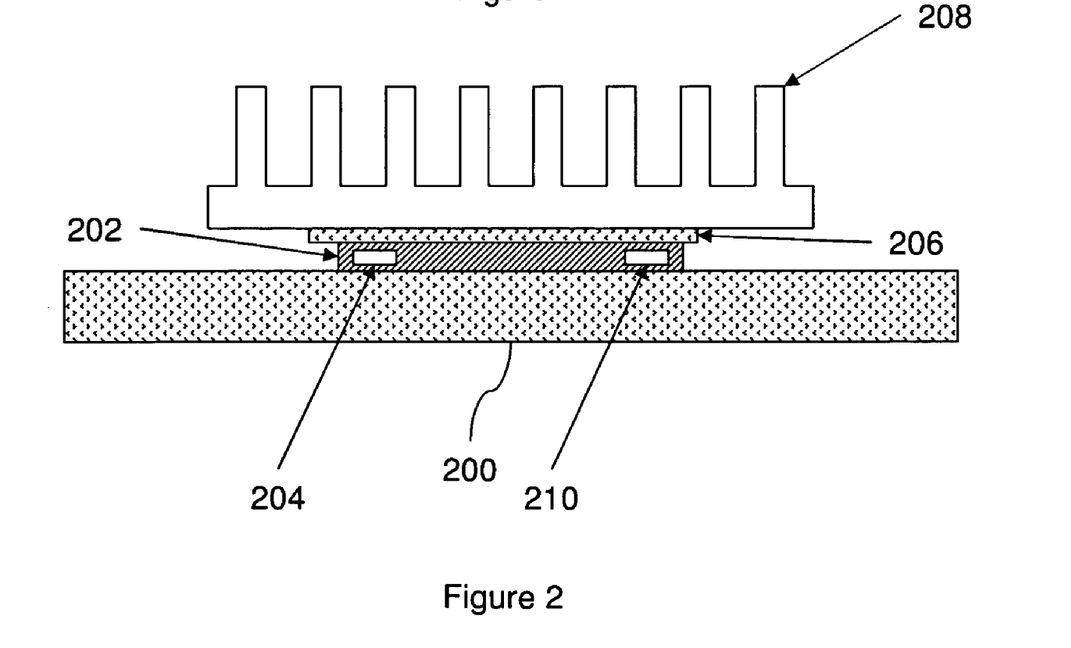
FIG. 2 is a schematic diagram of an integrated circuit chip structure according to embodiments herein.

One enabling technology for a thermal control monitor is an on-chip temperature sensor (OCTS) which is commonly formed of metal serpentines, or is based on the threshold voltage (Vt) of a PN junction diode. Such sensors are typically structures that are built as part of the semiconductor chip itself (are integral with the chip). FIG. 2 illustrates such an integrated circuit chip 202 (that includes an OCTS 204) that is mounted on a substrate 200. A heatsink 208 is attached to the top of the chip 202 with a thermal paste or other thermal material 206. In this example, the thermal material 206 and the heatsink 208 make up a "thermal solution" for the chip 202. Item 210 represents a memory area within the integrated circuit chip 202.

The quality and constancy of the performance of a thermal solution in a specific structures depends on many factors, such as the heatsink 208 material, the amount of physical contact between the heatsink 208 and the device 202, the interface material 206 (if any) used between the heatsink 208 and the device 202, etc. As the quality/constancy of this solution has a direct influence on the operation of the device, a monitor for the quality and consistency the thermal solution is highly desirable.

An OCTS can have a linear response to temperature. For example, when PN junction diodes are used, as the temperature of the diode increases, the threshold voltage of the diode decreases in a linear fashion. Embodiments herein work with such PN junction diode OCTS, and provide a method of applying a load and of measuring the power consumed by the device, to monitor the thermal resistance of the thermal solution. In other words, the embodiments herein evaluate the thermal performance of a specific structure using at least two test threshold voltages to establish the slope of a linear thermal response of the structure. This slope is sometimes referred to herein as the thermal response (Tr) or a "figure of merit." Once the slope is calculated, the thermal performance at any threshold voltage can be extrapolated to provide precise thermal control of the device under test.

One feature of the embodiments herein is that while an individual OCTS (by itself) may have a predicted relationship between threshold voltage and temperature (when it is considered separately from the whole thermal solution (or is physically separated from the chip and is considered as a distinct separate device)) the embodiments herein measure threshold voltage and temperature of not just the OCTS by itself, but instead measure the linear relationship of the thermal solution of the entire structure, that includes the heatsink, thermal paste, other cooling features, etc. The relationship between threshold voltage and actual temperature changes from the predicted relationship because of the various heat dissipating features, and the embodiments herein account for such changes. In other words, while it may be possible to predict how the threshold voltage of an OCTS may change with temperature changes, the embodiments herein test the entire completed structure (that includes heat dissipating features) and establish a new and different relationship of how the entire structure's heat performance characteristics change with the changing threshold voltage of the OCTS. Thus, the linear relationship between threshold voltage and temperature for the entire structure (chip and heat sink) that is produced by the embodiments herein will be different than the predicted relationship between threshold voltage and temperature for the OCTS alone.

Figure 3:
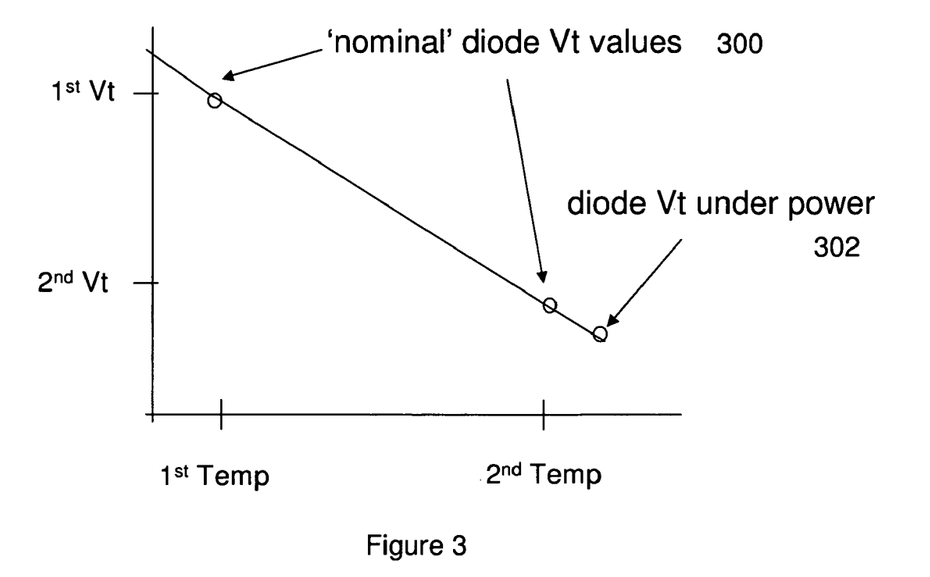
FIG. 3 is a graph illustrating the linear relationship established by embodiments herein.

One example of the application of the embodiments herein is shown in FIG. 3. More specifically, item 300 represents two points along a linear curve having a specific slope. The points 300 occur because a first temperature causes the OCTS to have a first threshold voltage and because a second temperature causes the OCTS to have a second threshold voltage. Points 300 are developed by testing a specific structure that has been previously manufactured. Point 302 represents an extrapolation of previously established linear response and demonstrates that, for any temperature, the threshold voltage of the diode within the OCTS can be determined. Similarly for any threshold voltage, the temperature of the diode within the OCTS can also be determined. Therefore, as shown in FIG. 3, the embodiments herein provide a monitor for the quality and consistency any thermal solution.

The value of Tr gives a "figure of merit" for the quality of the thermal control solution. A lower value (which is desirable) means that the temperature of the device stays closer to the starting setpoint value, given a power dissipation load. The value of Tr depends on many factors, such as the heatsink used (if any), the physical interface between the heatsink and the device (wet, dry, etc.), the method for cooling/heating the heatsink, the 'quality of contact' between the device and heatsink, and so forth.

Those ordinarily skilled in the art would understand that the examples discussed below are only illustrations that demonstrates how the invention works and that the invention would be applicable to all different values for all different types of structures. Therefore, one ordinarily skilled in the art would understand that the following examples do not limit the application of the invention and that these examples are only used for illustrative purposes.

Figure 4:
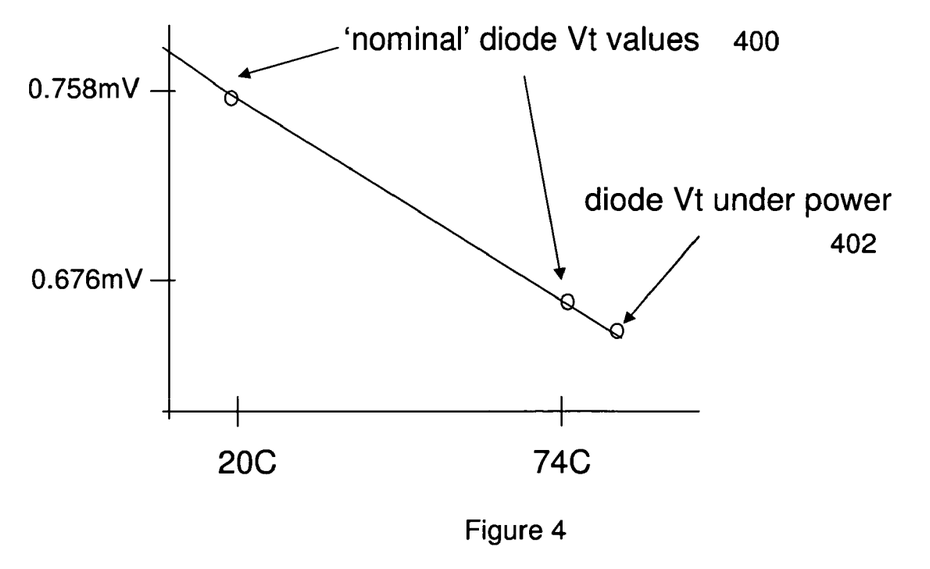
FIG. 4 is a graph illustrating the linear relationship established by embodiments herein.

In FIG. 4, the two nominal values 400 of the diode Vt are determined by measuring the device at a fixed temperature setting with no power load, and storing the results. From these nominal values 400, the slope of the linear relationship is established. For example, the results (slope) can be stored through the use of on-product mechanisms such as electrical fuses or non-volatile memory (such as item 210, discussed above), although external database storage mechanisms are also possible.

Given these two data points, an equation for the line connecting the points can be determined as: $Vt=m(T)+int$, where 'Vt' is the value of the OCTS diode Vt, T is temperature, m is the slope of the line connecting the two points. Using a specific example shown in FIG. 4, $m=(0.758-0.676)(20-74)=-0.001519$; and 'int' is the y-intercept of the line: $int=0.758-(-0.001519(20))=0.788$. If a load is applied to the device, the device will consume power, and the temperature will rise. To determine the amount of temperature rise that will occur under such a load, the value of the diode Vt can be measured while the load is applied, and the OCTS equation above can be used to calculate the temperature of the device. This allows the thermal performance to be extrapolated to provide precise thermal control of the device under test.

For example, starting with a 74° C. test temperature, the device dissipates 20 W, and the diode Vt of the OCTS is measured to be 0.666 under this power load. Then using the example from FIG. 4, the temperature of the device is calculated as follows: $0.666=-0.001519(T)+0.788$. Therefore, $T=(0.666-0.788)/-0.001519=80°$ C. Therefore, the device temperature has risen 80° C.-74° C.=6° C. and the normal resistance (Tr) is calculated as Tr=6° C./20 W=0.3 C/W.

Figure 5:
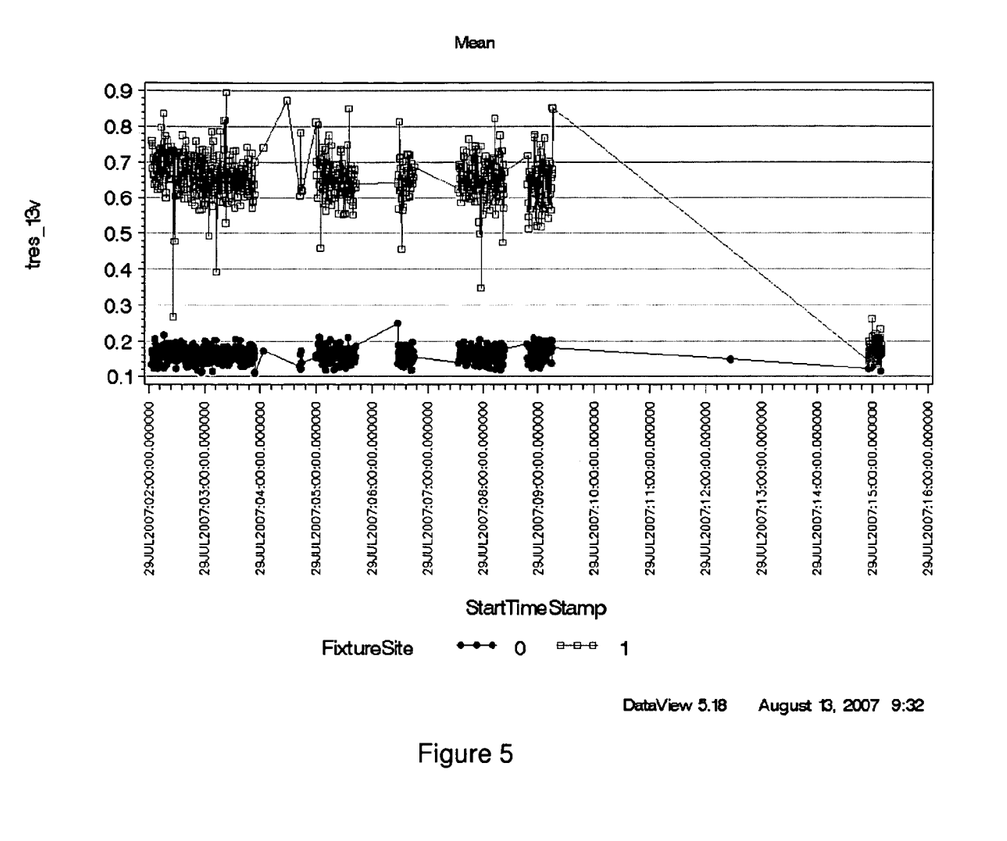
FIG. 5 is a graph illustrating the predictable mean and standard deviation achieved by embodiments herein.
Figure 6:
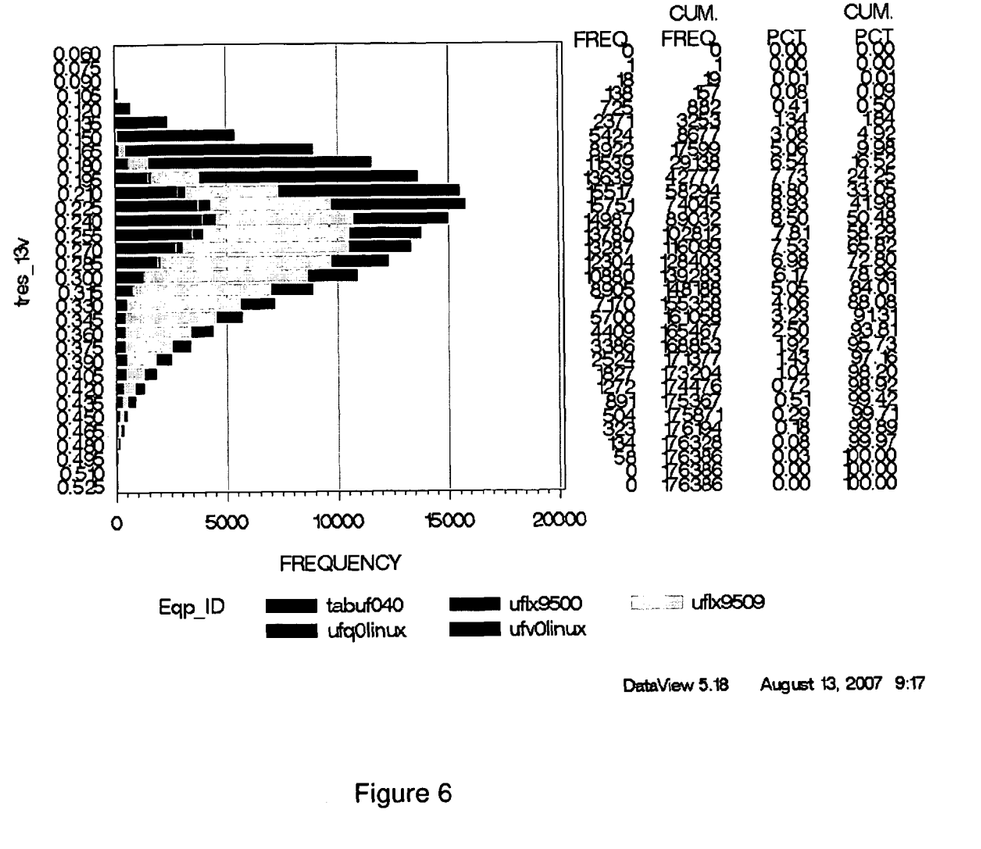
FIG. 6 is a graph illustrating how the embodiments herein can be utilized to trigger an alarm.

Referring now to FIGS. 5 and 6, which are graphs illustrating experimental data acquired using embodiments herein, for a given temperature control solution and a given device, the value of Tr should have a predictable mean value and a standard deviation under normal conditions. This is shown in FIG. 5 where a thermal response of 1.3V is illustrated to have various thermal resistance distributions in five different test equipment cells.

However, should there be some compromise of the thermal control solution, the value of Tr can give an indication that such a compromise has taken place, and corrective action can then be taken. Therefore, FIG. 6 illustrates an example where the thermal interface material (polypropylene glycol (ppg)) was disabled on one of the test fixtures. In the above example, the x-axis is the time of test, and the y-axis is Tr. In this example, there are two devices being tested at a time ('FixtureSite' 0 and 1). At the start of test, the liquid used as an interface between the device and the heatsink (polypropylene glycol, or 'ppg') was disabled on FixtureSite1, thus compromising the quality of thermal control, and resulting in an elevated Tr. Such a situation, if continuously monitored, could raise an alarm. After a pause, the ppg application was re-enabled on FixtureSite1, and the Tr then came back into the normally expected range.

Figure 7:
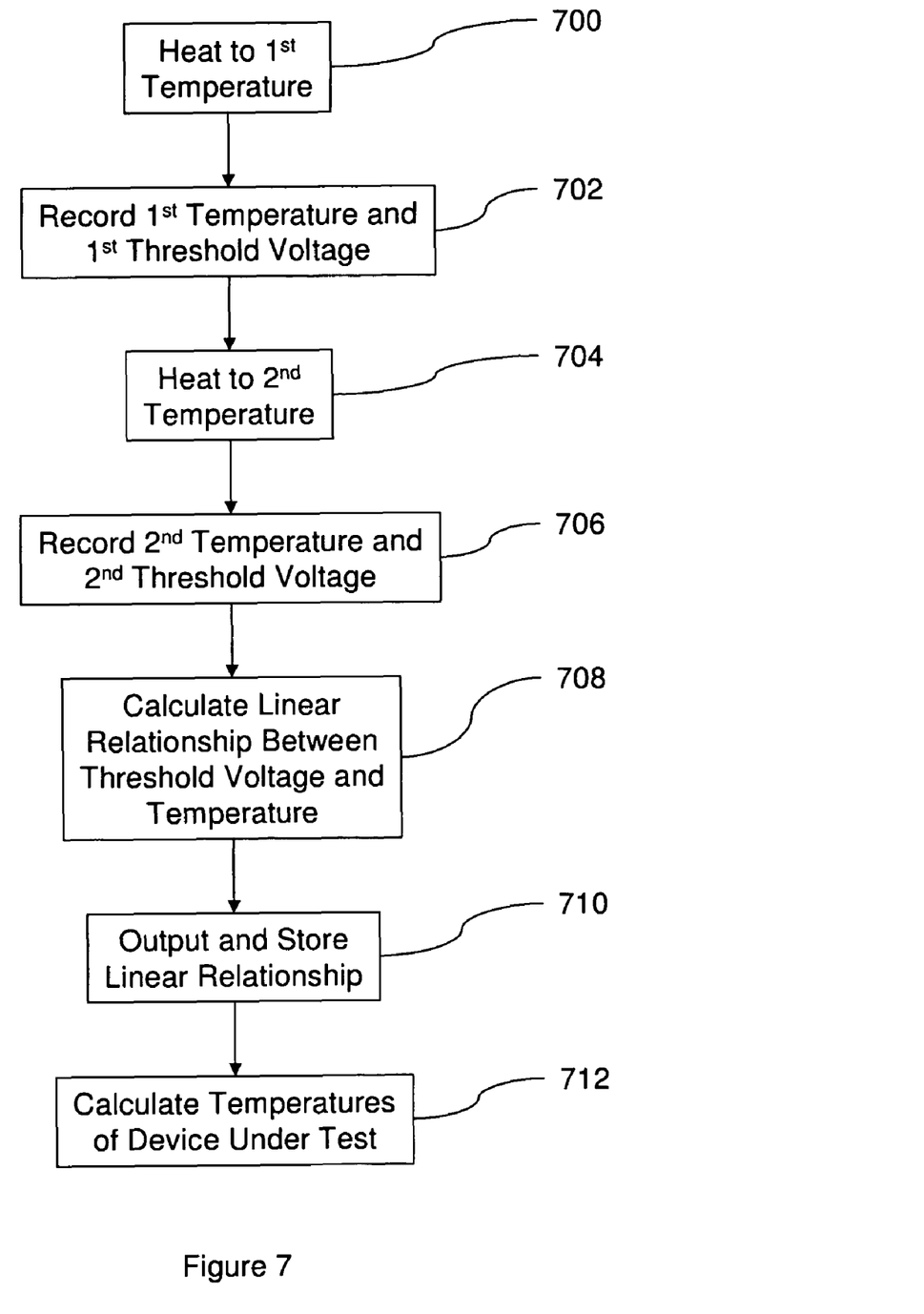
FIG. 7 is a flow diagram illustrating the operation of embodiments herein.

FIG. 7 illustrates this in flowchart form. More specifically, as shown in FIG. 7, the embodiments herein relate to a structure, such as the one shown in FIG. 2, that has a heat dissipating feature (e.g., heatsink 208, thermal paste 206, etc.); an internal temperature measurement device (e.g., an on-chip temperature sensor having a PN junction diode 202); and a memory (computer storage medium, fuses, etc. 210). The structure shown in FIG. 2 generates heat as power is supplied to the structure, and the threshold voltage of the internal temperature measurement device changes as the temperature of the temperature measurement device changes.

The embodiments herein establish a linear relationship between temperature and threshold voltage by, as shown in item 700, heating the structure to a first temperature. This heating process can be accomplished by operating the integrated circuit chip, or by applying an external heat source (e.g., resistive heater, furnace, etc.). In item 702, the process records a first threshold voltage of the internal temperature measurement device at the first temperature. This can be recorded in the memory of the chip, or in external memory. Similarly, in item 704, the process then heats the structure to a second temperature (different than the first temperature) and, in item 706, again records a second threshold voltage of the internal temperature measurement device at the second temperature.

From this, in item 708, the embodiments herein can calculate a linear relationship between temperature and threshold voltage based on the first temperature, the first threshold voltage, the second temperature, and the second threshold voltage. In item 710, the embodiments herein can then output and store the linear relationship.

Further, as shown in item 712, the embodiments herein can calculate the temperatures of the device under test based only upon the linear relationship and threshold voltages measured from internal temperature measurement devices. More specifically, as shown above, the process 712 of calculating the temperatures is based on the following equation: $Vt=m(T)+int$, where Vt is the threshold voltage, T is temperature, m is a slope of the linear relationship, and int is a point at which the linear relationship intersects a 0° temperature.

Thus, as shown above, with embodiments herein, given an integrated circuit with an OCTS, the temperature of the device under power can be determined for any threshold voltage level. This temperature will be dependent upon the quality of the thermal control solution, which can be characterized by a figure of merit called thermal resistance. This figure of merit can be monitored during device test to flag events where the thermal solution is compromised.

The embodiments of the invention can take the form of an entirely hardware embodiment, an entirely software embodiment or an embodiment including both hardware and software elements. In an embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Figure 8:
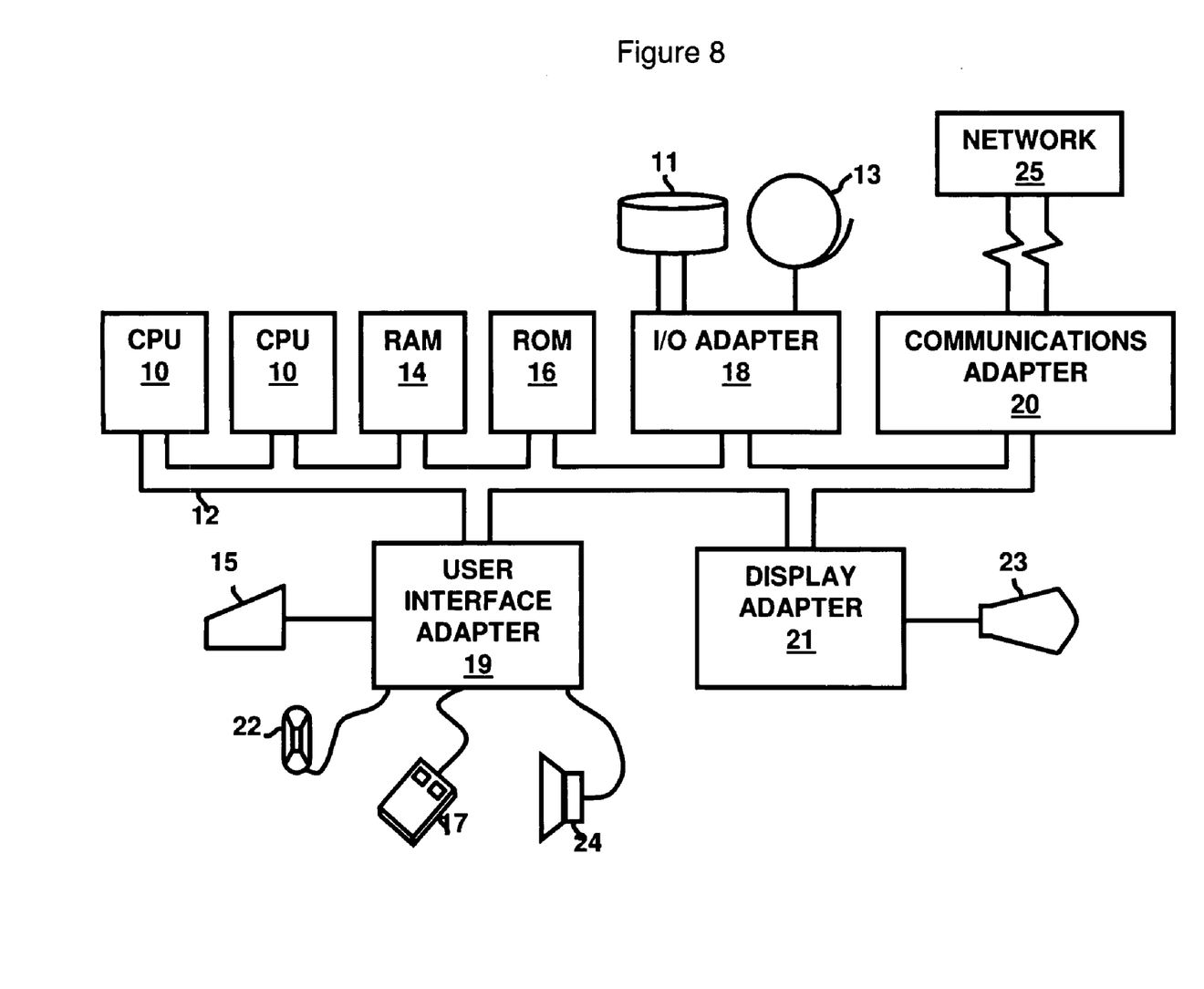
FIG. 8 is a schematic diagram illustrating an exemplary hardware environment that can be used to implement the embodiments herein.

A representative hardware environment for practicing the embodiments of the invention is depicted in FIG. 8. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. An apparatus comprising:
a structure, said structure generating heat as power is supplied to said structure;
a heat dissipating feature attached to said structure;
an internal temperature measurement device internal to said structure, a threshold voltage of said internal temperature measurement device changing as a temperature of said temperature measurement device changes; and
storage internal to said structure storing a linear relationship between temperature and threshold voltage, said linear relationship being established by:
heating said structure to a first temperature and recording a first threshold voltage of said internal temperature measurement device at said first temperature,
heating said structure to a second temperature, different than said first temperature, and recording a second threshold voltage of said internal temperature measurement device at said second temperature, and
calculating said linear relationship based on said first temperature, said first threshold voltage, said second temperature, and said second threshold voltage, and
temperatures of said structure being determined based only upon said linear relationship and threshold voltages measured from said internal temperature measurement devices.

2. The apparatus according to claim 1, said calculating of said temperatures being based on the following equation: $Vt=m(T)+int$, where $Vt$ is said threshold voltage, $T$ is temperature, $m$ is a slope of said linear relationship, and $int$ is a point at which said linear relationship intersects a 0° temperature.

3. The apparatus according to claim 1, said internal temperature measurement device comprising a PN junction diode.

4. The apparatus according to claim 1, said internal temperature measurement device having a predicted relationship between threshold voltage and temperature that is different than said linear relationship.

5. The apparatus according to claim 1, wherein said heat dissipating structure comprises a heatsink.

6. An apparatus comprising:
a integrated circuit chip structure, said integrated circuit chip structure generating heat as power is supplied to said integrated circuit chip structure;
a heat dissipating feature attached to said integrated circuit chip structure;
an on chip temperature sensor internal to said integrated circuit chip structure, a threshold voltage of said on chip temperature sensor changing as a temperature of said temperature measurement device changes; and
storage internal to said integrated circuit chip structure storing a linear relationship between temperature and threshold voltage, said linear relationship being established by:
heating said integrated circuit chip structure to a first temperature and recording a first threshold voltage of said on chip temperature sensor at said first temperature,
heating said integrated circuit chip structure to a second temperature, different than said first temperature, and recording a second threshold voltage of said on chip temperature sensor at said second temperature, and
calculating said linear relationship based on said first temperature, said first threshold voltage, said second temperature, and said second threshold voltage, and
temperatures of said integrated circuit chip structure being determined based only upon said linear relationship and threshold voltages measured from said on chip temperature sensor.

7. The apparatus according to claim 6, said calculating of said temperatures being based on the following equation: $Vt=m(T)+int$, where $Vt$ is said threshold voltage, $T$ is temperature, $m$ is a slope of said linear relationship, and $int$ is a point at which said linear relationship intersects a 0° temperature.

8. The apparatus according to claim 6, said on chip temperature sensor comprising a PN junction diode.

9. The apparatus according to claim 6, said on chip temperature having a predicted relationship between threshold voltage and temperature that is different than said linear relationship.

10. The apparatus according to claim 6, wherein said heat dissipating integrated circuit chip structure comprises a heatsink.

11. A method comprising:
supplying a structure having a heat dissipating feature, an internal temperature measurement device, said structure generating heat as power is supplied to said structure, and a threshold voltage of said internal temperature measurement device changing as a temperature of said temperature measurement device changes;
heating said structure to a first temperature and recording a first threshold voltage of said internal temperature measurement device at said first temperature;
heating said structure to a second temperature, different than said first temperature, and recording a second threshold voltage of said internal temperature measurement device at said second temperature;
calculating a linear relationship between temperature and threshold voltage based on said first temperature, said first threshold voltage, said second temperature, and said second threshold voltage;
outputting said linear relationship;
storing said linear relationship; and
calculating temperatures of said structure based only upon said linear relationship and threshold voltages measured from said internal temperature measurement devices.

12. The method according to claim 11, said calculating of said temperatures being based on the following equation: $Vt=m(T)+int$, where $Vt$ is said threshold voltage, $T$ is temperature, $m$ is a slope of said linear relationship, and $int$ is a point at which said linear relationship intersects a 0° temperature.

13. The method according to claim 11, said internal temperature measurement device comprising a PN junction diode.

14. The method according to claim 11, said internal temperature measurement device having a predicted relationship between threshold voltage and temperature that is different than said linear relationship.

15. The method according to claim 11, wherein said heat dissipating structure comprises a heatsink.

16. A method comprising:
supplying an integrated circuit chip structure having a heat dissipating feature, an on chip temperature sensor, said integrated circuit chip structure generating heat as power is supplied to said integrated circuit chip structure, and a threshold voltage of said on chip temperature sensor changing as a temperature of said temperature measurement device changes;
heating said integrated circuit chip structure to a first temperature and recording a first threshold voltage of said on chip temperature sensor at said first temperature;
heating said integrated circuit chip structure to a second temperature, different than said first temperature, and recording a second threshold voltage of said on chip temperature sensor at said second temperature;
calculating a linear relationship between temperature and threshold voltage based on said first temperature, said first threshold voltage, said second temperature, and said second threshold voltage;
outputting said linear relationship;
storing said linear relationship; and
calculating temperatures of said integrated circuit chip structure based only upon said linear relationship and threshold voltages measured from said on chip temperature sensors.

17. The method according to claim 16, said calculating of said temperatures being based on the following equation: $Vt=m(T)+int$, where $Vt$ is said threshold voltage, $T$ is temperature, $m$ is a slope of said linear relationship, and $int$ is a point at which said linear relationship intersects a 0° temperature.

18. The method according to claim 16, said on chip temperature sensor comprising a PN junction diode.

19. The method according to claim 16, said on chip temperature having a predicted relationship between threshold voltage and temperature that is different than said linear relationship.

20. The method according to claim 16, wherein said heat dissipating structure comprises a heatsink.

* * * * *